(12) United States Patent
Kinyua

(10) Patent No.: US 8,325,074 B2
(45) Date of Patent: Dec. 4, 2012

(54) METHOD AND CIRCUIT FOR CONTINUOUS-TIME DELTA-SIGMA DAC WITH REDUCED NOISE

(75) Inventor: Martin Kinyua, Austin, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 66 days.

(21) Appl. No.: 13/053,303

(22) Filed: Mar. 22, 2011

(65) Prior Publication Data

US 2012/0242521 A1      Sep. 27, 2012

(51) Int. Cl.
   *H03M 3/00*      (2006.01)
(52) U.S. Cl. ........ 341/143; 375/265; 375/219; 375/298; 375/320; 378/91
(58) Field of Classification Search .......... 341/143–155; 375/265, 219, 298, 320, 327, 319; 378/91
   See application file for complete search history.

(56) References Cited

U.S. PATENT DOCUMENTS

| | | | |
|---|---|---|---|
| 5,153,593 A * | 10/1992 | Walden et al. ................. | 341/143 |
| 5,369,403 A * | 11/1994 | Temes et al. .................. | 341/143 |
| 5,870,048 A * | 2/1999 | Kuo et al. ..................... | 341/143 |
| 6,300,890 B1 * | 10/2001 | Okuda et al. .................. | 341/143 |
| 6,323,794 B1 * | 11/2001 | Okuda et al. .................. | 341/143 |
| 6,369,731 B1 * | 4/2002 | Takeda et al. .................. | 341/143 |
| 6,538,589 B2 * | 3/2003 | Okuda et al. .................. | 341/143 |
| 6,639,531 B1 * | 10/2003 | Melanson ..................... | 341/143 |
| 6,980,144 B1 | 12/2005 | Maloberti et al. | |
| 7,009,540 B1 * | 3/2006 | Chen et al. .................... | 341/143 |
| 7,205,920 B2 | 4/2007 | Morrow et al. | |
| 7,432,841 B1 | 10/2008 | Kinyua | |
| 7,532,141 B2 * | 5/2009 | Kitahira et al. ............... | 341/152 |
| 7,710,300 B2 * | 5/2010 | Kwan ............................ | 341/143 |
| 7,860,189 B2 * | 12/2010 | Petilli et al. .................... | 375/316 |
| 8,031,096 B2 * | 10/2011 | Kinyua .......................... | 341/143 |

OTHER PUBLICATIONS

Rueger, T. et al., "A 110dB Ternary PWM Current-Mode Audio DAC with Monolithic 2Vrms Driver", IEEE International Solid-State Circuits Conference, Digest of Technical Papers, ISSCC 2004, Session 20, Digital-to-Analog Converters/20.7, (1):10 pages.

Xu, X. et al., "The Implementation of Dual-Truncation Sigma/Delta D/A Converters", Circuits and Systems, May 1992, ISCAS '92 Proceedings, (2):597-600.

Aziz, P.M. et al., "An Overview of Sigma-Delta Converters: How a 1-bit ADC Achieves More Than 16-bit Resolution", IEEE Signal Processing Magazine, Jan. 1996, 13(1):61-84.

* cited by examiner

*Primary Examiner* — Lam T Mai
(74) *Attorney, Agent, or Firm* — Duane Morris LLP

(57) ABSTRACT

A continuous-time delta-sigma digital-to-analog converter (DAC) includes a first delta-sigma modulator configured to quantize a most significant bit or bits of a digital input signal and produce a first quantization error signal, and a second multi-stage delta-sigma modulator configured to quantize less significant bits of the digital input signal. A first DAC is coupled to an output of the first delta-sigma modulator, and a second DAC is coupled to an output of the second noise-shaping filter. The second DAC has a greater resolution than the first DAC. A low pass output filter is coupled to a sum of an output of the first DAC and an output of the second DAC.

22 Claims, 4 Drawing Sheets

US 8,325,074 B2

METHOD AND CIRCUIT FOR CONTINUOUS-TIME DELTA-SIGMA DAC WITH REDUCED NOISE

TECHNICAL FIELD

The present disclosure relates to continuous-time delta-sigma digital-to-analog converters (DACs) and to methods of reducing noise in same.

BACKGROUND

Delta-sigma modulators generally employ noise-shaping (filtering) and over-sampling to perform digital-to-analog ("D/A") conversion at relatively high resolution for signals of modest bandwidth. The higher the order of the sigma-delta modulator, the further the quantization noise is pushed into the frequency band, away from the signal base band being converted. As such, DACs using delta-sigma modulators have become popular in a wide range of high precision applications, such as audio applications.

In a typical sigma-delta DAC architecture, a digital data signal (e.g. 16 bit audio data at a rate of 48 kHz) is upsampled by an interpolator at some multiple of the original data rate (e.g., at an upsampling ratio of 128 times (6.144 MHz/48 kHz)). The resulting oversampled digital signal is applied to a multi-bit sigma-delta modulator. The multi-bit digital data outputted by the modulator is applied to a multi-bit DAC, which may comprise a multi-bit current DAC (IDAC) to generate a multi-level analog current signal followed by a current-to-voltage converter to convert this analog current signal to an analog voltage signal. Finally, the stepped voltage signal is applied to a low pass filter to provide a smoothed analog output signal.

There are several problems with the known approaches to delta-sigma DACs, some of which are noted hereafter. First, known DACs require intrinsically low noise circuits, which are power and area hungry. Second, known approaches require the use of chopper stabilization to reduce low frequency 1/f noise in the CMOS circuits, which adds design complexity. Finally, these approaches require current sources with very high output impedances.

BRIEF DESCRIPTION OF THE DRAWINGS

The accompanying drawings illustrate preferred embodiments of the disclosure, as well as other information pertinent to the disclosure, in which.

DETAILED DESCRIPTION

This description of the exemplary embodiments is intended to be read in connection with the accompanying drawings, which are to be considered part of the entire written description. Terms concerning electrical attachments, coupling and the like, such as "connected", "interconnected," and "coupled" refer to a relationship wherein structures communicate with one another either directly or indirectly through intervening structures, unless expressly described otherwise. In contrast, for example, when an element is referred to as being "directly coupled" to another element, there are no intervening elements present.

Figure 1:
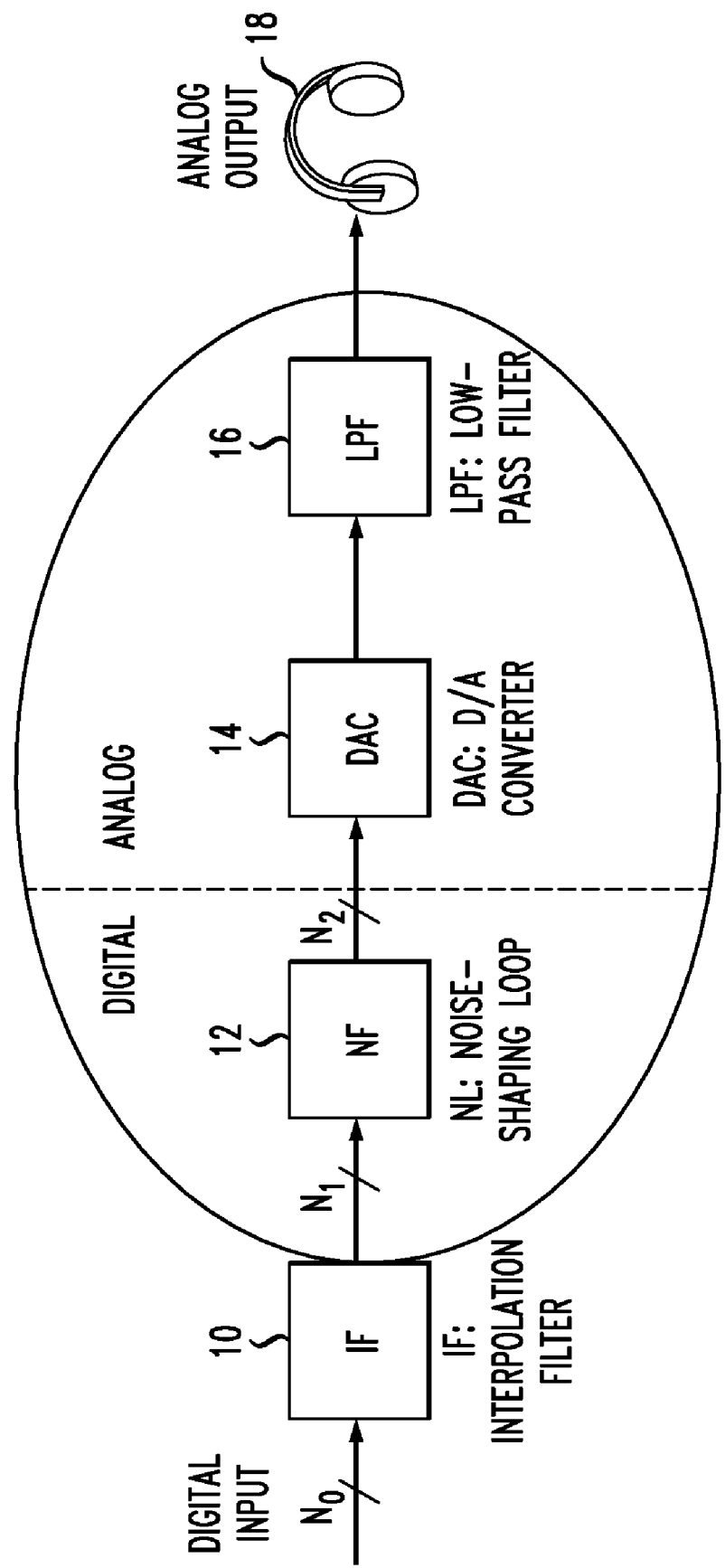
FIG. 1 is a block diagram illustrating a sigma-delta DAC.

By way of introduction, FIG. 1 is a block diagram view of a sigma-delta DAC. The DAC includes digital and analog sections. The digital section includes an interpolation filter 10 and a noise-shaping loop 12, and the analog section includes a DAC 14 (which can really be considered the bridge from the digital section to the analog section), and a low pass filter 16. The output of the sigma-delta DAC is coupled to an analog output device, such as headphones 16 or other device (e.g., speakers). As will be familiar to those in the art, the interpolation filter 10 is a conventional device that upsamples the digital input $N_o$ (e.g. 16 bit audio data at a rate of 48 kHz) and provides some oversampled digital output $N_1$ (e.g., at an oversampling ratio of 128 times (6.144 MHz/48 kHz)). The oversampling ratio is some ratio beyond the Nyquist rate so that the noise is spread beyond the original frequency band and over a larger frequency band. The interpolation filter is of conventional design and will not be described further herein.

The noise-shaping loop 12 takes the quantization noise that has been spread over a larger bandwidth by the interpolation filter 10 and suppresses the low frequency noise. More specifically, the noise shaping loop pushes most of the noise out to higher frequencies. Digital signal $N_2$ typically has fewer bits (i.e., lower resolution) than $N_1$ as there is a truncation operation in the noise-shaping loop 12. The DAC 14 then converts the signal to analog. This DAC can be operated in a continuous or discrete time fashion. With respect to the present disclosure, the DAC is operated in continuous time. Finally, the low pass filter 14 filters out images of the signal and out-of-band noise to recover the original analog signal.

The present disclosure focuses on improvements to the noise-shaping loop 12, DAC 14 and low pass filter 16 blocks shown in FIG. 1. Embodiments of an over-sampled continuous time sigma-delta digital-to-analog converter (DAC) with reduced noise and methods of digital-to-analog conversion using the same are illustrated herein. As described in more detail below, the novel noise-shaping loop offers the ability to achieve higher resolution for the same area as prior art sigma-delta DACs. An improved output DAC/filter stage is also provided in the analog stage which exhibits the ability to reduce thermal and 1/f noise. This stage converts the output current into voltage using a reconstruction amplifier in a manner such that substantial amount of this noise is converted into common-mode, which is rejected by the differential nature of the circuit.

The sigma-delta topography described herein does not: (i) require either the intrinsically low noise circuits of the prior art, which by default will consume more power and area than the proposed solution; (ii) require the use of chopper stabilization circuits, which increase design complexity, to reduce 1/f noise in circuits; or (iii) require current sources with very high output impedance. By 1/f noise, those of skill in the art will understand that it is meant the noise that is dominant at lower frequencies due to impurities in the channel-oxide interface of the transistors of CMOS devices and is common to all CMOS devices. Because this noise dominates at low frequencies, it is a particular concern for audio outputs.

Figure 2:
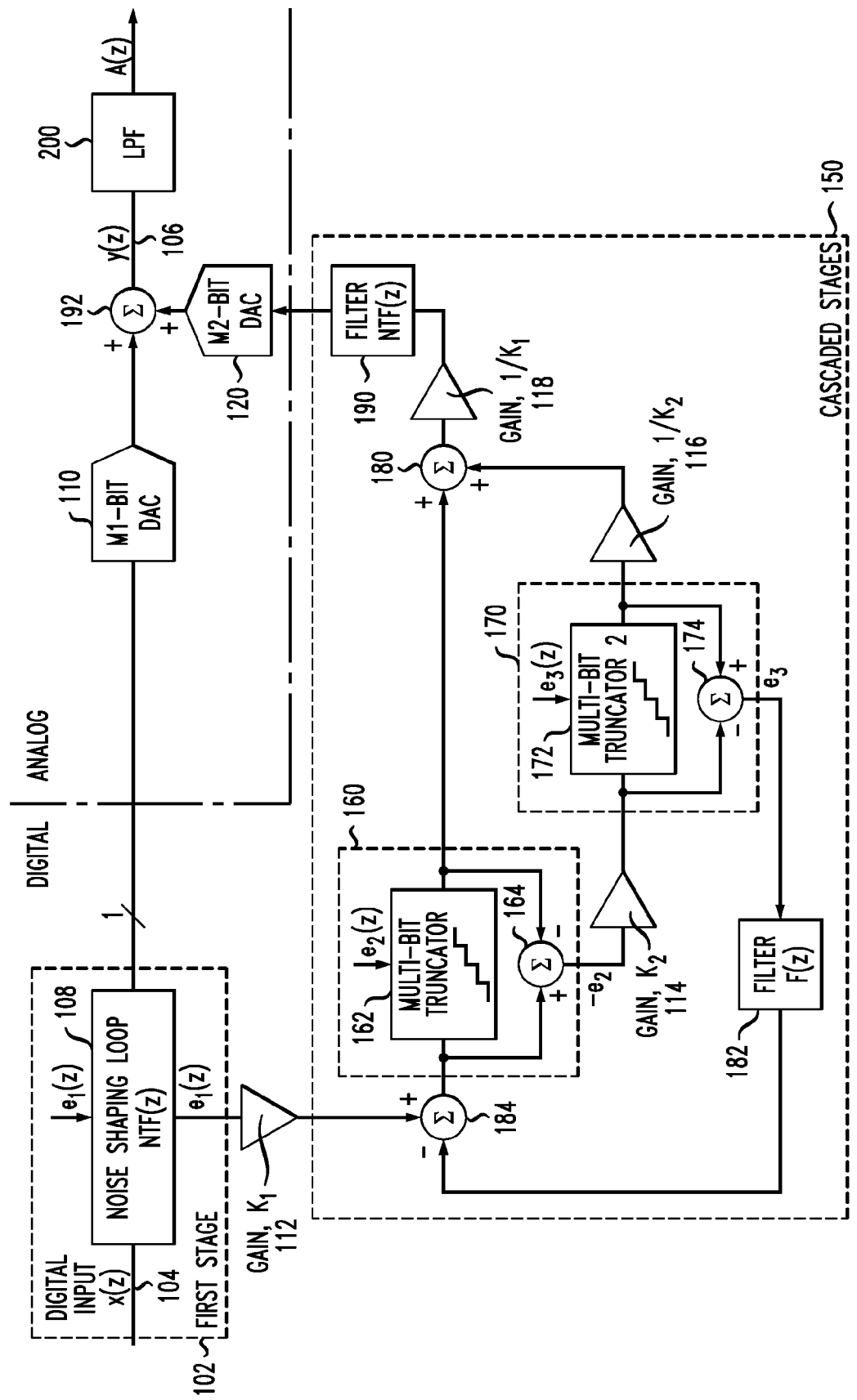
FIGS. 2 and 3 are signal flow diagrams illustrating an embodiment of the noise-shaping loop of an improved continuous-time sigma-delta DAC topology.

FIG. 2 illustrates an embodiment of a noise shaping loop of an improved continuous time sigma-delta DAC. With reference to FIG. 1, the diagram of FIG. 2 relates principally to the noise-shaping loop block 12 and secondarily to the DAC block 14. The combination of the noise shaping loop and DAC are referred to by the reference 100. The operation of these components is illustrated in FIG. 2 by way of signal flow diagram. The noise-shaping loop includes a first delta-sigma modulator stage 102 and a second multi-stage delta-sigma modulator stage 150. A digital input (represented by "x") is provided at input node 104 to the first delta-sigma modulator stage 102, and an analog output (represented by "y") is provided at output node 106, which is coupled through a LPF to provide the final analog representation A(z) of the digital input signal "x". The first stage 102 is a classical first order delta sigma modulator with a noise shaping loop 108 having a noise transfer function NTF(z), where the variable "z" represents the sampled-data transform variable as generally recognized in the art. As will be understood, the noise shaping loop 108 typically includes an n-stage integrator and a coarse quantization stage (i.e., truncator), with its relatively large coarse quantization error represented by error signal $e_1(z)$. The digital input signal x is reduced to a low resolution bit stream in the noise-shaping loop. The output bit stream of the first stage 102 is provided to a first DAC 110, labeled M1-bit DAC, which has a resolution of M1-bits and converts the output of the noise shaping loop 108 linearly. In embodiments, M1 is one bit, though this is not a requirement and any practical number of bits can be selected (i.e., 1 or more).

The residual truncation error signal e1(z) is coupled to the second multi-stage delta-sigma modulator stage 150. More specifically, the first error signal e1(z) is coupled to the second stage 150 through an inter-stage gain 112. The function is set preferably to a constant gain K1. The second stage 150 includes a pair or cascaded quantizers, specifically a first quantization stage 160 including a first multi-bit quantizer (truncator) 162, which quantizes the next most significant bits, and a second quantization stage 170 including a second multi-bit quantizer 172, which quantizes the least significant bits.

Quantization noise signals generated by quantizers 162 and 172 are illustrated as noise signals $e_2(z)$ and $e_3(z)$. Specifically, noise signal $-e_2$ is provided from summer 164, which subtracts the output of the first quantizer 162 from its input, and noise signal $e_3$ is provided from summer 174, which subtracts the input of the second quantizer 172 from its output. The output of first quantization stage, i.e., error signal $-e_2$, is provided to the input of the second quantization stage 170 after passing through the block represented by gain stage 114. The filtering function of this stage is set preferably to a constant gain $K_2$.

The output of the second quantizer 172 is scaled by gain stage 116. The function of this stage is set preferably to a constant gain $1/K_2$ (i.e., to the inverse of gain stage 114). The conversion results of the first and second quantization stages 160, 170, i.e., the output of truncator 162 and the output of the gain stage 116, are summed in summer 180.

The noise-shaping filter represented by the filter transfer function F(z) in block 182 filters the error signal $e_3$, producing a filtered quantization error signal at its output. This filtered quantization error signal is subtracted from the filtered quantization error signal $e_t$ at summer 184 to produce the input signal for the quantizer 162 in the quantization stage 160.

The output of summer 180 is scaled by gain stage 118. The scaling function of this stage 118 is set preferably to constant gain $1/K_1$ (i.e., to the inverse of gain stage 112). The output of gain stage 118 is filtered in noise-shaping filtering block 190 to produce the conversion of results of the cascaded multi-stage delta-sigma modulator 150. Noise-shaping filtering block 190 has the same transfer function as that of the noise shaping loop 108 (i.e., NTF(z)). These conversion results are provided to a second DAC 120, labeled M2-bit DAC, which has a finer resolution of M2-bits than DAC 110 (i.e., M2>M1). The outputs of DACs 110, 120 are summed by summer 192 to provide analog output signal y.

Figure 3:
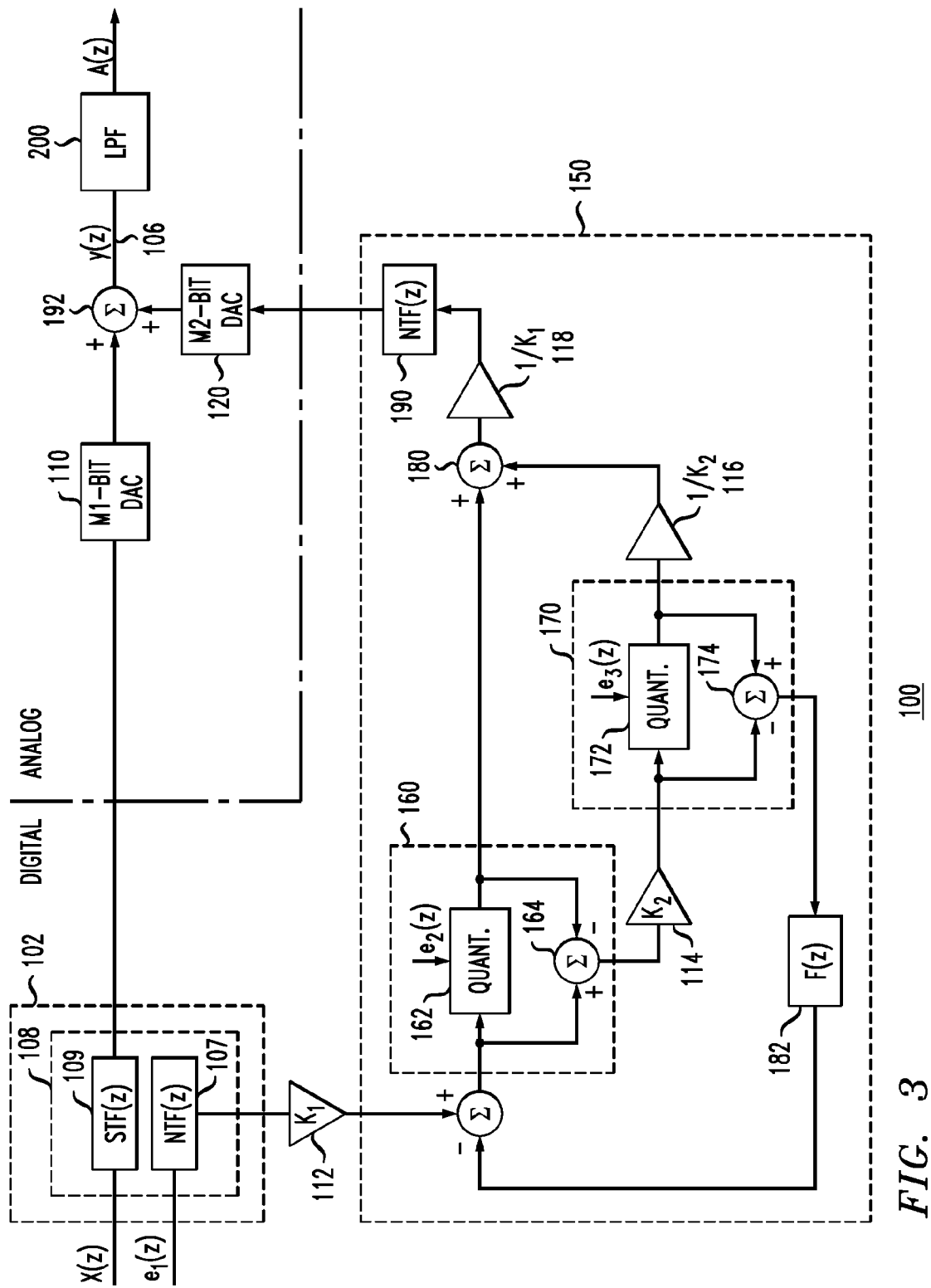

FIG. 3 illustrates another way of looking at the DAC 100, and specifically the noise shaping loop 108, where: X(z) is the digital input signal; STF(z) is the signal transfer function of the noise shaping loop 108; NTF(z) is the noise transfer function of the noise shaping loop 108; A(z) is the output; $e_1(z)$ is the first stage truncation error; $K_1$ is a first inter-stage gain; $e_2(z)$ is the multi-bit truncation error of quantizer 162; $e_3(z)$ is the multi-bit truncation error of quantizer 172; $K_2$ is a second inter-stage gain; and F(z) is a digital filter. The output y(z) can be expressed by the following equation: $y(z)=x(z) \cdot STF(z)+e_3/(k_1 \cdot k_2) \cdot (1-F(z) \cdot k_2) \cdot NTF(z)$. From the equation, it can be seen that the new topology introduces several design options for quantization noise cancelation and higher-order noise shaping. The choice of the noise-shaping filters depends on practical considerations, such as ease of implementation, sensitivity of noise cancellation to analog circuit non-idealities, and dynamic range.

For example, assume the following conditions: (i) $STF(z)=z^{-1}$, which is a simple delay function; (ii) $NTF(z)=(1-z^{-1})^n$, which represents an nth order differencing function; and (iii) $F(z)=z^{-1}/k_2$. Using these conditions, we know that $(1-F(z) \cdot_2)=1-z^{-1}$. As such, these conditions yield: $Y(z)=x(z) \cdot z^{-2}+(1-z^{-1})^3 \cdot e_3/(k_1 \cdot k_2)$. The first part of the sum (i.e., $x(z) \cdot z^{-2}$) simply represents a delay in the input signal. More significantly, the second part of the sum illustrates a third order noise shaping (i.e., high pass filtering) of the error $e_3$, scaled by the $K_1$ and $K_2$ inter-stage gains. Of particular note, coarse quantization error $e_t$ and the error $e_2$ of quantization stage 160 are removed. All that remains is the fine error of the final cascade stage 170 but scaled down and filtered.

The quantization noise suppression corresponds to a single composite DAC with $M2*k_1*k_2$ levels, which would be the equivalent composite DAC, while employing (as noted above) fewer DAC unit elements than prior art approaches. For example, assume a DAC resolution of M1+M2 bits. With the approach described above in connections with FIGS. 2 and 3, the number of DAC elements would be $2^{M1}+2^{M2}$. So, if M1 is 2 and M2 is 3, then the approach uses 12 DAC elements. In comparison to, for example, the approach described in T. Rueger, et al., "A 110 dB Ternary PWM Current-Mode Audio DAC with Monolithic 2Vrms Driver", §20.7 (2004), that approach would use $2^{(M1+M2)}$ DAC elements, which is an exponential increase over the approach described herein, and would require 32 DAC elements. With the approach described in FIGS. 2 and 3, there is a reduction in analog computation in exchange for increased digital computation. This allows for reduced DAC component count and thus reduced area and lower power for the same resolution as the prior art, or increased resolution at the same area cost as the prior art.

Figure 4:
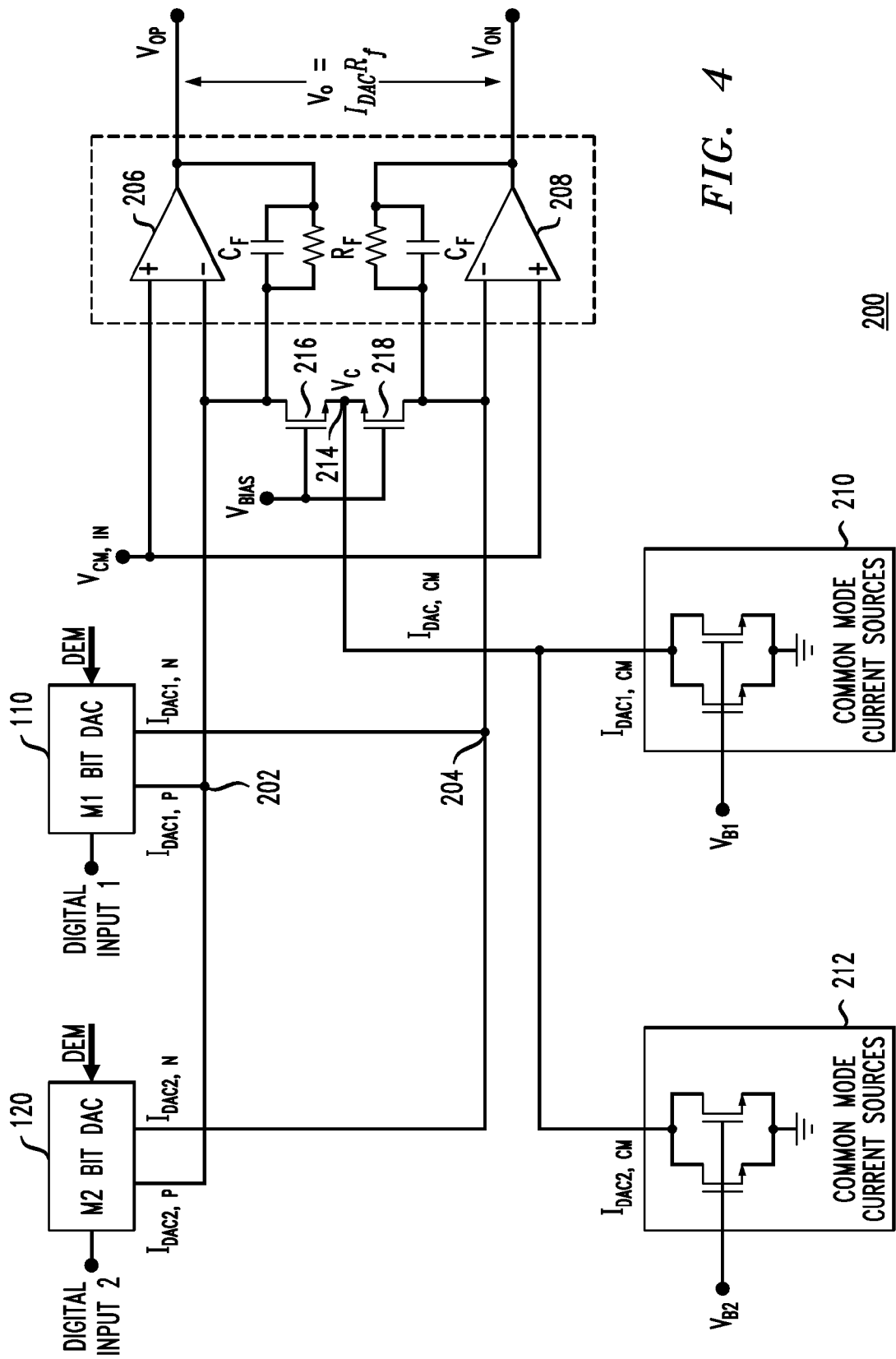
FIG. 4 illustrates an embodiment of a reconstruction DAC/Low Pass Filter (henceforth LPF) circuit for use in an improved continuous-time sigma-delta DAC topology.

As noted above, improvements in the reconstruction DAC and LPF of a continuous time delta-sigma DAC are also disclosed herein. FIG. 4 illustrates a circuit diagram of a reconstruction DAC/low pass filter 200. The M1-bit DAC 110 and M2-bit DAC 120 from FIGS. 2 and 3 are also shown for ease of illustration. These DACs, which are multi-bit current DACS (IDACs) have fully differential analog current outputs $I_{DAC1,P}/I_{DAC1,N}$ and $I_{DAC2,P}/I_{DAC2,N}$. IDACs are known in the art and are not described in further detail so as to not obscure the present disclosure. Currents $I_{DAC1,P}$ and $I_{DAC2,P}$ are summed together at node 202. A prior art DAC error suppression method known as Dynamic Element Matching (DEM) is applied to linearize the IDAS and also reduce 1/f noise. Currents $I_{DAC1,N}$ and $I_{DAC2,N}$ are summed together at node 204. These summed currents are inputs to a continuous time current-voltage (I-V) reconstruction amplifier.

The continuous-time I-V reconstruction amplifier includes first and second operational amplifiers 206, 208. The inverting inputs (−) of the first and second op-amps 206, 208 are coupled to nodes 202, 204, respectively, and the non-inverting inputs (+) are coupled common mode bias voltage $V_{CM,IN}$. The outputs of the op-amps 206, 208 are fed back to the inverting inputs via respective paths that include a resistor $R_F$ in parallel with a capacitor $C_F$. The op-amps in connection with the resistors $R_F$ act as a current-to-voltage converter. The resistors $R_F$ in parallel with the capacitors $C_F$ act as a low pass filter.

A pair of common mode current sources 210, 212, which provide common mode currents $I_{DAC1,CM}$ and $I_{DAC2,CM}$, respectively, for setting the output common mode current level are coupled to node 214. Node 214 is coupled to the nodes 202, 204 via a pair of cascode transistor devices 216, 218, respectively. These cascode devices 216, 218 do not introduce transistor noise to the output node, These transistors act to increase the output impedance of the current sources 210, 212 to avoid a large drift in the output common mode. Summing currents $I_{DAC2,CM}$ and $I_{DAC1,CM}$ at node 214 and connecting that node to the inverting inputs of the op-amps 206, 208 allows for the differential canceling of any noise (mainly thermal and 1/f) introduced by the common mode current sources 210, 212.

It should be understood that IDAC1,CM corresponds to M1 Bit DAC and IDAC2,CM corresponds to M2 Bit DAC in FIG. 4. Current IDAC1,CM sets the common mode level of the aggregate currents at the output. For example, looking at the contribution of the M1 bit DAC and IDAC1,CM currents to the outputs, in one embodiment, if IDAC1,CM=IDAC1P+IDAC1N, then the currents at the output nodes Vop and Von become the following: at node Vop current is IDAC1P-IDAC1,CM/2; and at node Von current is IDAC1N-IDAC1,CM/2. The differential current is the current at Vop minus the current at Von, which is IDAC1P-IDAC1N. The common mode current is the sum of the currents, divided by 2, which is 0 because IDAC1,CM=IDAC1P+IDAC1N. Therefore IDAC1,CM effectively sets the output common mode level of the aggregated M1 BIT DAC and IDAC1,CM currents. The same analysis applies looking instead at the contribution of the M2 bit DAC and IDAC2,CM currents to the outputs.

Voltages Vb1 and Vb2 can be the same or different, depending on the design. These voltages are bias voltages to set the IDAC1,CM and IDAC2,CM currents respectively.

With prior art circuits, such as those described in U.S. Pat. No. 7,205,920 to Morrow et al. and T. Rueger, et al., "A 110 dB Ternary PWM Current-Mode Audio DAC with Monolithic 2Vrms Driver", ISSCC (2004), each common mode current generator injects a current noise into the output nodes, and this noise is not canceled at the output by the differential subtraction of $I_{DAC,P}$ and $I_{DAC,N}$. As such, in prior art circuits, chopper stabilization is typically used to reduce in-band 1/f noise at both the IDACs 110, 120 and at the pulldown current sources 210, 212. This chopper stabilization is conspicuously absent from the common mode current sources 210, 212. The improved approach shown in FIG. 4 for connecting the common mode current sources eliminates the need for chopping at the pull down current sources. Nor are dynamic element matching (DEM) techniques (shown illustratively at the IDAC stages 110, 120) required to counter 1/f noise in the lower half of the circuit 200.

That the illustrated configuration of circuit 200 adds no noise to the output from the common mode current sources 210, 212, which would require countermeasures like DEM and/or chopper stabilization to remove, can be mathematically illustrated. The output $V_O$ can be derived as shown below, per Kirchoffs's Current Law.

First, we know that the output current of the op-amp 206 must equal its input current, per application of the current law at node 202. Thus, equation 1: $(V_{op}-V_{cm,in})/R_F+(I_{dac1,cm}+I_{dac2,cm})/2+I_{dac1,p}+I_{dac2,p}=0$.

Likewise, we know that the output current of the op-amp 208 must equal its input current, per application of the current law at node 204. Thus, equation 2: $(V_{on}-V_{cm,in})/R_F+(I_{dac1,cm}+I_{dac2,cm})/2+I_{dac1,n}+I_{dac2,n}=0$.

Subtracting equation 1 from equation 2 provides: $(V_{op}-V_{on})/R_F+I_{dac1,p}+I_{dac2,p}-(I_{dac1,n}+I_{dac2,n})=0$. Solving for $V_o$, which equals $V_{op}-V_{on}$, then $V_o=((I_{dac1,p}+I_{dac2,p})-(I_{dac1,n}+I_{dac2,n}))\cdot R_F$. As can be seen from this equation, the output voltage $V_o$ has no $I_{DAC1,CM}$ or $I_{DAC2,CM}$ term, meaning it contains no noise from the common mode current sources 210, 212 even without providing 1/f chopping stabilization. In addition any other errors in current sources 210 and 212 have no impact on the differential output because they appear as common mode artifacts. Therefore those current sources do not require high output impedance in contrast to prior art implementations.

The ability to reduce thermal and 1/f transistor noise in this way is somewhat counterintuitive, as the common wisdom in the art is that that in order to reduce these types of transistor noise it is necessary to either increase power (i.e., current consumption) and/or the size (W/L area) of the transistor. However, as demonstrated above, this new configuration illustrates the ability to cancel out the noise attributable to the transistors of the common mode current sources 210, 212 without increasing either transistor size or current consumption.

The noise shaping loop of FIGS. 2 and 3 and described herein was modeled as a second order loop using MATLAB/SIMULINK™ software. A representative noise simulation of the DAC/LPF disclosed herein was also modeled using CADENCE/SPECTRE™ software. The combined results, which are illustrative of the performance of a continuous-time delta-sigma DAC constructed in accordance with these teachings, showed about a 6 dB improvement in signal-to-noise ratio over conventional designs for the same input power.

Per the foregoing description, a continuous time sigma-delta DAC is presented that employs a novel configuration for higher order noise shaping cascaded stages with feedback and error quantization error filtering. The DAC can also employ an improved reconstruction DAC/LPF circuit that converts part of their noise into common mode, which is then cancelled by fully differential implementation. Some advantages of these approaches when compared to conventional approaches include the ability to attain higher resolution than conventional designs for the same component count, better noise performance with less circuit complexity, and higher SNR for the same power. Further, the common mode level setting current sources do not limit the noise performance or linearity of the DAC. Moreover, no output common-mode amplifier is required in contrast with certain conventional designs.

In one embodiment of a continuous-time delta-sigma digital-to-analog converter (DAC), the DAC includes: a first delta-sigma modulator configured to quantize a most significant bit or bits of a digital input signal and produce a first quantization error signal, and a second multi-stage delta-sigma modulator configured to quantize less significant bits of the digital input signal. The second multi-stage delta sigma modulator includes a first quantization stage coupled to a difference of the first quantization error signal and a second quantization error signal and configured to quantize next most significant bits of the digital input signal and produce a third quantization error signal representing a difference between an input and an output of the first quantization stages; a second quantization stage with an input coupled to the third quantization error signal and configured to quantize least significant bits of the digital input signal and produce the second quantization error signal representing a difference between the input and an output of the second quantization stage; a first noise-shaping filter for filtering the second quantization error signal, the output of the first noise-shaping filter subtracted from the first quantization error signal to produce the input of the first quantization state; and a second noise-shaping filter having an input coupled to a sum of an output of the first quantization stage and an output of the second quantization stage. The continuous-time delta-sigma modulator also includes a first DAC coupled to an output of the first delta-sigma modulator; a second DAC coupled to an output of the second noise-shaping filter; and a low pass output filter coupled to a sum of an output of the first DAC and an output of the second DAC, wherein the second DAC has a greater resolution than the first DAC.

An exemplary embodiment of a method of continuous-time digital-to-analog conversion, includes the steps of: receiving a digital input signal; converting the digital input signal to a low resolution digital signal representing the most significant bit or bits of the digital input signal with a first delta-sigma modulator; producing a first quantization error signal resulting from converting the digital input signal to the low resolution digital signal in the first delta-sigma modulator; and quantizing less significant bits of the digital input signal in a second multi-stage delta-sigma modulator, the quantizing comprising. The quantizing includes the following steps: quantizing next most significant bits of the digital input signal in a first quantization stage of the second multi-stage delta-sigma modulator using a difference of the first quantization error signal and a second quantization error signal; producing a third quantization error signal representing a difference between an input and an output of the first quantization stage of the second multi-stage delta-sigma modulator; quantizing in a second quantization stage of the second multi-stage delta-sigma modulator least significant bits of the digital input signal with an input coupled to the third quantization error signal; producing the second quantization error signal representing a difference between the input of the second quantization stage and an output of the second quantization stage of the second multi-stage delta-sigma modulator; coupling a first noise-shaping filter to the second quantization error signal, and subtracting an output of the first noise-shaping filter from the first quantization error signal to produce the input of the first quantization stage of the second multi-stage delta-sigma modulator; and coupling a sum of an output of the first quantization stage and an output of the second quantization stage to a second noise-shaping filter. The output of the first delta-sigma modulator is coupled to a first digital-to-analog converter (DAC), and the output of the second noise-shaping filter is coupled to a second DAC. The method includes the further step of low pass filtering a sum of an output of the first DAC and an output of the second DAC, wherein the second DAC has a greater resolution than the first DAC.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A continuous-time delta-sigma digital-to-analog converter (DAC), comprising:
   a first delta-sigma modulator configured to quantize a most significant bit or bits of a digital input signal and produce a first quantization error signal;
   a second multi-stage delta-sigma modulator configured to quantize less significant bits of the digital input signal, the second multi-stage delta sigma modulator comprising:
      a first quantization stage coupled to a difference of the first quantization error signal and a second quantization error signal and configured to quantize next most significant bits of the digital input signal and produce a third quantization error signal representing a difference between an input and an output of the first quantization stages;
      a second quantization stage with an input coupled to the third quantization error signal and configured to quantize least significant bits of the digital input signal and produce the second quantization error signal representing a difference between the input and an output of the second quantization stage;
      a first noise-shaping filter for filtering the second quantization error signal, the output of the first noise-shaping filter subtracted from the first quantization error signal to produce the input of the first quantization state; and
      a second noise-shaping filter having an input coupled to a sum of an output of the first quantization stage and an output of the second quantization stage;
   a first DAC coupled to an output of the first delta-sigma modulator;
   a second DAC coupled to an output of the second noise-shaping filter; and
   a low pass output filter coupled to a sum of an output of the first DAC and an output of the second DAC, wherein the second DAC has a greater resolution than the first DAC.

2. The continuous-time delta-sigma DAC of claim 1, further comprising:
   a third noise shaping filter for filtering the first quantization error signal prior to being coupled to the second multi-stage delta-sigma modulator; and
   a fourth noise-shaping filter for filtering the sum of the output of the first quantization stage and the output of the second quantization stage, wherein the filtering functions of the third and fourth noise-shaping filters are reciprocal functions.

3. The continuous-time delta-sigma DAC of claim 2, wherein the filtering function of the third noise shaping filter is a constant.

4. The continuous-time delta-sigma DAC of claim 1, further comprising:
   a third noise-shaping filter for filtering the third quantization error signal before being provided to the second quantization stage; and
   a fourth noise-shaping filter for filtering the output of the second quantization stage before being summed with the output of the first quantization stage,
   wherein the filtering functions of the third and fourth noise-shaping filters are reciprocal functions.

5. The continuous-time delta-sigma DAC of claim 4, wherein the filtering function of the third noise-shaping filter is a constant.

6. The continuous-time delta-sigma DAC of claim 5, wherein the filtering function of the first noise-shaping filter comprises the filtering function $z^{-1}$ divided by the constant.

7. The continuous-time delta-sigma DAC of claim 1, further comprising:
a third noise-shaping filter for filtering the third quantization error signal before being provided to the second quantization stage, wherein the filtering function of the third noise-shaping filter is a constant, and the filtering function of the first noise-shaping filter comprises the filtering function $z^{-1}$ divided by the constant.

8. The continuous-time delta-sigma DAC of claim 1, wherein the first delta-sigma modulator is characterized by a noise transfer function, and wherein the filtering function of the second noise-shaping filter matches the noise transfer function of the first delta-sigma modulator.

9. The continuous-time delta-sigma DAC of claim 1, wherein the first DAC is a one-bit DAC.

10. The continuous-time delta-sigma DAC of claim 1, wherein the first and second DACs are fully differential current DACs, wherein the low-pass output filter is part of a continuous time current-to-voltage converter.

11. The continuous-time delta-sigma DAC of claim 10, wherein each current DAC has first and second differential current outputs, the current-to-voltage converter comprising:
first and second operational amplifiers, each operational amplifier having inverting and noninverting inputs and an output, wherein the first differential current outputs of the current DACs are combined at a first node, the first node being coupled to the inverting input of the first operational amplifier, and wherein the second differential current outputs of the current DACs are combined at a second node, the second node being coupled to the inverting input of the second operational amplifier, the noninverting inputs of the operational amplifiers being coupled to a common mode voltage node; and
a first RC circuit coupled between the output of the first operational amplifier and the inverting input of the first operational amplifier;
a second RC circuit coupled between the output of the second operational amplifier and the inverting input of the second operational amplifier;
a pair of cascode connected transistors coupled between the inverting inputs of the first and second operational amplifiers, the transistors being coupled together at a third node; and
a pulldown current source coupled to the third node.

12. The continuous-time delta-sigma DAC of claim 11, wherein noise generated by the pulldown current source is differentially canceled by the current-to-voltage converter.

13. The continuous-time delta-sigma DAC of claim 1, further comprising:
a third noise shaping filter for filtering the first quantization error signal prior to being coupled to the second multi-stage delta-sigma modulator;
a fourth noise-shaping filter for filtering the sum of the output of the first quantization stage and the output of the second quantization stage, wherein the filtering functions of the third and fourth noise-shaping filters are reciprocal functions and the filtering function of the third noise shaping filter is a constant;
a fifth noise-shaping filter for filtering the third quantization error signal before being provided to the second quantization stage; and
a sixth noise-shaping filter for filtering the output of the second quantization stage before being summed with the output of the first quantization stage, wherein the filtering functions of the fifth and sixth noise-shaping filters are reciprocal functions and the filtering function of the third noise-shaping filter is a second constant, wherein the filtering function of the first noise-shaping filter comprises the filtering function $z^{-1}$ divided by the second constant.

14. The continuous-time delta-sigma DAC of claim 13, wherein the first delta-sigma modulator is characterized by a noise transfer function, and wherein the filtering function of the second noise-shaping filter matches the noise transfer function of the first delta-sigma modulator.

15. A method of continuous-time digital-to-analog conversion, comprising the steps of:
receiving a digital input signal;
converting the digital input signal to a low resolution digital signal representing the most significant bit or bits of the digital input signal with a first delta-sigma modulator;
producing a first quantization error signal resulting from converting the digital input signal to the low resolution digital signal in the first delta-sigma modulator;
quantizing less significant bits of the digital input signal in a second multi-stage delta-sigma modulator, the quantizing comprising:
quantizing next most significant bits of the digital input signal in a first quantization stage of the second multi-stage delta-sigma modulator using a difference of the first quantization error signal and a second quantization error signal;
producing a third quantization error signal representing a difference between an input and an output of the first quantization stage of the second multi-stage delta-sigma modulator;
quantizing in a second quantization stage of the second multi-stage delta-sigma modulator least significant bits of the digital input signal with an input coupled to the third quantization error signal;
producing the second quantization error signal representing a difference between the input of the second quantization stage and an output of the second quantization stage of the second multi-stage delta-sigma modulator;
coupling a first noise-shaping filter to the second quantization error signal, and subtracting an output of the first noise-shaping filter from the first quantization error signal to produce the input of the first quantization stage of the second multi-stage delta-sigma modulator; and
coupling a sum of an output of the first quantization stage and an output of the second quantization stage to a second noise-shaping filter;
coupling an output of the first delta-sigma modulator to a first digital-to-analog converter (DAC);
coupling an output of the second noise-shaping filter to a second DAC; and
low pass filtering a sum of an output of the first DAC and an output of the second DAC, wherein the second DAC has a greater resolution than the first DAC.

16. The method of continuous-time digital-to-analog conversion of claim 15, comprising the further steps of:
filtering the first quantization error signal prior to being coupled to the second multi-stage delta-sigma modulator by a third noise shaping filter; and
filtering the sum of the output of the first quantization stage and the output of the second quantization stage by a fourth noise-shaping filter for filtering,
wherein the filtering functions of the third noising shaping filter is a constant and the filtering function of the fourth noise-shaping filter is a reciprocal of the constant.

17. The method of continuous-time digital-to-analog conversion of claim 15, comprising the further steps of:
- filtering the third quantization error signal before being provided to the second quantization stage by a third noise-shaping filter; and
- filtering the output of the second quantization stage by a fourth noise-shaping filter for before being summed with the output of the first quantization stage,
- wherein the filtering functions of the third noising shaping filter is a constant and the filtering function of the fourth noise-shaping filter is a reciprocal of the constant.

18. The method of continuous-time digital-to-analog conversion of claim 17, wherein the filtering function of the first noise-shaping filter comprises the filtering function $z^{-1}$ divided by the constant.

19. The method of continuous-time digital-to-analog conversion of claim 15, further comprising filtering the third quantization error signal by a third noise-shaping filter before being provided to the second quantization stage, wherein the filtering function of the third noise-shaping filter is a constant, and the filtering function of the first noise-shaping filter comprises the filtering function $z^{-1}$ divided by the constant.

20. The method of continuous-time digital-to-analog conversion of claim 15, wherein the first delta-sigma modulator is characterized by a noise transfer function, wherein the filtering function of the second noise-shaping filter matches the noise transfer function of the first delta-sigma modulator.

21. The method of continuous-time digital-to-analog conversion of claim 15, wherein the first and second DACs are fully differential current DACs, each current DAC having first and second differential current outputs, the method further comprising the step of summing the differential current outputs of the current DACs and converting the summed currents to voltages using a current-to-voltage converter, the current-to-voltage converter performing the low pass filtering step.

22. The method of continuous-time digital-to-analog conversion of claim 21, wherein the current-to-voltage converter comprises first and second operational amplifiers, each operational amplifier having inverting and noninverting inputs and an output, wherein the first differential current outputs of the current DACs are combined at a first node, the first node being coupled to the inverting input of the first operational amplifier, and wherein the second differential current outputs of the current DACs are combined at a second node, the second node being coupled to the inverting input of the second operational amplifier, the noninverting inputs of the operational amplifiers being coupled to a common mode voltage node, the method further comprising the steps of:
- feeding the output of the first operational amplifier back to the inverting input of the first operational amplifier through a first RC circuit;
- feeding the output of the second operational amplifier back to the inverting input of the second operational amplifier through a second RC circuit; and
- coupling a pulldown current source to the inverting inputs of the first and second operational amplifiers in a configuration to differentially cancel through the current-to-voltage converter noise generated by the pulldown current source.

\* \* \* \* \*

UNITED STATES PATENT AND TRADEMARK OFFICE
CERTIFICATE OF CORRECTION

| | | |
|---|---|---|
| PATENT NO. | : 8,325,074 B2 | Page 1 of 1 |
| APPLICATION NO. | : 13/053303 | |
| DATED | : December 4, 2012 | |
| INVENTOR(S) | : Martin Kinyua | |

It is certified that error appears in the above-identified patent and that said Letters Patent is hereby corrected as shown below:

In the Specification

Column 3, Line 54, delete "$e_i$" and insert -- $e_1$ --.

Signed and Sealed this
Twenty-sixth Day of November, 2013

Margaret A. Focarino
*Commissioner for Patents of the United States Patent and Trademark Office*